(12) United States Patent
Murata et al.

(10) Patent No.: US 7,078,743 B2
(45) Date of Patent: Jul. 18, 2006

(54) FIELD EFFECT TRANSISTOR SEMICONDUCTOR DEVICE

(75) Inventors: Tomohiro Murata, Osaka (JP); Yutaka Hirose, Kyoto (JP); Yoshito Ikeda, Osaka (JP); Tsuyoshi Tanaka, Osaka (JP); Kaoru Inoue, Shiga (JP); Daisuke Ueda, Osaka (JP); Yasuhiro Uemoto, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 54 days.

(21) Appl. No.: 10/834,362

(22) Filed: Apr. 29, 2004

(65) Prior Publication Data

US 2005/0001235 A1 Jan. 6, 2005

(30) Foreign Application Priority Data

May 15, 2003 (JP) .............................. 2003-136980

(51) Int. Cl.
*H01L 31/0328* (2006.01)
(52) U.S. Cl. .................... 257/192; 257/12; 257/20; 257/E21.395; 257/E21.399
(58) Field of Classification Search ................ 257/192, 257/12, 20, E21.395, E21.399; 438/285, 438/590
See application file for complete search history.

(56) References Cited

U.S. PATENT DOCUMENTS

| 5,225,707 | A | * | 7/1993 | Komaru et al. ............. 257/513 |
| 5,362,678 | A | * | 11/1994 | Komaru et al. ............. 438/167 |
| 5,917,209 | A | * | 6/1999 | Andoh ........................ 257/284 |
| 6,476,431 | B1 | * | 11/2002 | Ohno et al. .................. 257/280 |
| 2001/0023964 | A1 | * | 9/2001 | Wu et al. ..................... 257/368 |
| 2002/0017696 | A1 | * | 2/2002 | Nakayama et al. ......... 257/471 |
| 2003/0020092 | A1 | * | 1/2003 | Parikh et al. ............... 257/192 |
| 2003/0213975 | A1 | * | 11/2003 | Hirose et al. ............... 257/194 |

FOREIGN PATENT DOCUMENTS

| JP | 5-21474 | 1/1993 |
| JP | 11-45892 | 2/1999 |
| JP | 2002-270822 | 9/2002 |
| JP | 2002-536847 | 10/2002 |
| WO | WO 00/48248 | 8/2000 |

OTHER PUBLICATIONS

Masumi Fukuda et al.; "Basis for GaAs Field Effect Transistor"; *The Institute of Electronics, Information and Engineers;* c. 1992; p. 214-217.

Yuji Ando et al.; "Characterization of High Breakdown Voltage AlGaN/GaN Heterojunction FETs with a Field Plate Gate"; *Photonic abd Wireless Devices Research Laboratories;* c. 2002; pp. 29-34.

* cited by examiner

*Primary Examiner*—Eugene Lee
(74) *Attorney, Agent, or Firm*—McDermott Will & Emery LLP

(57) ABSTRACT

A semiconductor device has: a buffer layer formed on a conductive substrate and made of $Al_xGa_{1-x}N$ with a high resistance; an element-forming layer formed on the buffer layer, having a channel layer, and made of undoped GaN and N-type $Al_yGa_{1-y}N$; and a source electrode, a drain electrode and a gate electrode which are selectively formed on the element-forming layer. The source electrode is filled in a through hole provided in the buffer layer and the element-forming layer, and is thus electrically connected to the conductive substrate.

14 Claims, 14 Drawing Sheets

FIELD EFFECT TRANSISTOR SEMICONDUCTOR DEVICE

BACKGROUND OF THE INVENTION

The present invention relates to a semiconductor device including a Group III–V nitride semiconductor, and in particular relates to a field effect semiconductor device in which an electrode is provided on a bottom surface of a substrate.

Group III–V nitride semiconductors such as gallium nitride (GaN), aluminum nitride (AlN) and indium nitride, i.e., a mixed crystal thereof represented by the following general formula: $Al_xGa_{1-x-y}In_yN$ (where $0 \leq x \leq 1$, and $0 \leq y \leq 1$), are examined not only for application to a short-wavelength optical device that utilizes a wide bandgap and a direct transition type band structure, which are physical properties of the mixed crystal, but also for application to an electron device because of the other properties of the mixed crystal such as a high breakdown electric field and a high saturation electron velocity.

In particular, a heterojunction field effect transistor (hereinafter, will be called an "HFET") that utilizes a two-dimensional electron gas (hereinafter, will be called "2DEG") generated at the interface between an $Al_xGa_{1-x}N$ layer (where $0<x \leq 1$) and a GaN layer, sequentially epitaxially grown over a semi-insulating substrate, is being developed as a high-power device or a high-frequency device. This HFET is characterized, for example, by allowing not only supply of electrons from a carrier supply layer (i.e., an N-type AlGaN barrier layer) but also supply of electrical charges due to polarization effects including spontaneous polarization and piezo-polarization, and by having an electron density higher than $10^{13}$ cm$^{-2}$ which is approximately ten times as large as that of an AlGaAs/GaAs-containing FET. Therefore, this HFET can be expected to have a drain current density higher than that of a GaAs-based HFET, and a device with a maximum drain current exceeding 1 A/mm is reported (see, for example, "Characterization of High Breakdown Voltage AlGaN/GaN Heterojunction FETs with a Field Plate Gate" written by Yuji Ando, Yasuhiro Okamoto, Hironobu Miyamoto, Tatsumine Nakayama, Takashi Inoue and Masaaki Kuzuhara, Technical Report of IEICE, ED2002-214, CPM2002-105(2002-10), pp. 29–34). Further, since a Group III–V nitride semiconductor (such as GaN) has a wide bandgap (of 3.4 eV, for example), the resulting device exhibits a high breakdown voltage characteristic, and thus a breakdown voltage between gate and drain electrodes can be equal to or higher than 100V (see the aforementioned document). As described above, since an electron device including a Group III–V nitride semiconductor, typified by an HFET, can be expected to exhibit electrical characteristics that achieve high breakdown voltage and high current density, such an electron device is examined for application as a high-frequency device or as a device that can deal with high power with a design size smaller than a conventional one.

However, although an electron device including a Group III–V nitride semiconductor is promising as a high-frequency or high-power device, various contrivances have to be made for implementation of such an electron device. As a contrivance for implementing the device that exhibits high-frequency characteristic and high-power characteristic, a technique for using a via hole structure is known.

Hereinafter, a FET that uses such a conventional via hole structure will be described with reference to FIG. 14.

As shown in FIG. 14, a semiconductor layer 102 made of N-type GaAs and including a channel layer (active layer) is formed on an insulative substrate 101 made of gallium arsenide (GaAs) whose thickness is reduced to about 25 μm. Formed on the semiconductor layer 102 are: a Schottky electrode 103; and ohmic source electrode 104 and drain electrode 105 which are provided on both sides of the Schottky electrode 103. A via hole 106 is selectively formed in portions of the insulative substrate 101 and the semiconductor layer 102 which are located below the source electrode 104. On a surface of the insulative substrate 101 opposite to the semiconductor layer 102 (i.e., a bottom surface of the insulative substrate 101), a bottom-surface electrode 107 is formed so as to fill the via hole 106, and the bottom-surface electrode 107 is connected to a ground power supply 108. It is reported that since the FET, whose source electrode 104 is grounded via the bottom-surface electrode 107 and the via hole 106 in this manner, can reduce its source inductance as compared with a FET whose source electrode 104 is grounded via wiring, the former FET achieves an improvement in linear gain by about 2 dB (see, for example, "Basis for GaAs Field Effect Transistor" written by Masumi Fukuda and Yasutaka Hirachi, The Institute of Electronics, Information and Communication Engineers, 1992, p.214).

In addition, as one of other conventional examples, Japanese Unexamined Patent Publication No. 2002-536847 discloses a structure in which a source electrode or emitter electrode is connected to a conductive P$^+$-type substrate grounded through a via hole; on the other hand, Japanese Unexamined Patent Publication No. 11-45892 discloses a structure and a fabrication method in which a substrate made of silicon carbide (SiC) or sapphire is polished to reduce the thickness thereof, and a via hole is formed from the bottom surface of the polished substrate by etching.

Besides, Japanese Unexamined Patent Publication No. 05-21474 discloses a structure in which side faces of a through-type via hole and the bottom surface of a substrate are covered with an insulating film.

However, the structure that uses the aforementioned conventional via hole presents the following problems.

First, due to an electric field applied between the substrate 101 and the semiconductor layer 102 including the active layer, a leakage current is produced between the substrate 101 and the semiconductor layer 102. Secondly, SiC or sapphire used for the substrate 101 is normally very hard and highly resistant to chemicals; therefore, it is considerably difficult to form the via hole 106 in the substrate 101 made of SiC or sapphire so that the via hole 106 passes therethrough to reach the bottom surface of the substrate 101, while maintaining the strength of the substrate 101, i.e., while not reducing the thickness of the substrate 101. On the other hand, if the substrate 101 made of SiC or sapphire is polished to reduce its thickness and then the via hole 106 is formed, the substrate 101 whose thickness is reduced becomes fragile, and therefore, the situation where the substrate 101 is cracked in the step of forming the via hole 106 is brought about.

Accordingly, the semiconductor device connected to the bottom-surface electrode 107 through the conventional via hole presents the problem that the device cannot sufficiently achieve high-frequency characteristic and high-power characteristic.

SUMMARY OF THE INVENTION

In view of the above-described problems, an object of the present invention is to prevent a leakage current produced between a substrate and a semiconductor layer and to facilitate formation of a via hole so that high-frequency characteristic and high-power characteristic are achieved in a semiconductor device including a Group III–V nitride semiconductor and having a via hole structure.

In order to achieve the above object, in an inventive semiconductor device including a Group III–V nitride semiconductor, a substrate on which a semiconductor layer including a channel layer is held is used as a conductive substrate, and a via hole is formed only in the semiconductor layer to electrically connect a source electrode or a drain electrode to the conductive substrate.

Specifically, a first semiconductor device according to the present invention is characterized by including: a conductive substrate; a first semiconductor layer formed on the conductive substrate and made of a first Group III–V nitride semiconductor with a high resistance; a second semiconductor layer formed on the first semiconductor layer, having a channel layer, and made of a second Group III–V nitride semiconductor; and a source electrode, a drain electrode and a gate electrode which are selectively formed on the second semiconductor layer, wherein the source electrode is filled in a through hole provided in the first semiconductor layer and the second semiconductor layer, and is thus electrically connected to the conductive substrate.

In the first semiconductor device, it is possible to form an electrode on a bottom surface of the conductive substrate without providing any via hole in the conductive substrate. Thus, not only formation of a via hole is facilitated but also the thickness of the substrate does not have to be reduced; therefore, it becomes possible to obtain the semiconductor device including the Group III–V nitride semiconductors and having excellent high-frequency characteristic and high-power characteristic while maintaining the strength of the conductive substrate.

In the first semiconductor device, the thickness of the first semiconductor layer is preferably set such that the first semiconductor layer has a breakdown voltage higher than a maximum voltage applied to the drain electrode. In such an embodiment, since it is possible to suppress the leakage current flowing between the conductive substrate and the channel layer, the high-power characteristic can be improved.

In the first semiconductor device, it is preferable that: the conductive substrate is a P-type semiconductor substrate; and the thickness of the first semiconductor layer and the dopant concentration of the semiconductor substrate are set such that a maximum voltage, which can be supported by the first semiconductor layer and a depletion layer extended in the semiconductor substrate, becomes higher than a maximum voltage applied to the drain electrode. In such an embodiment, it is possible to further reduce the leakage current flowing between the P-type semiconductor substrate and the second semiconductor layer having the channel layer. It should be noted that the P-type semiconductor substrate is used as the conductive substrate because of the following reasons. If a ground potential is applied to the electrode on the bottom surface of the semiconductor substrate and a positive potential is applied to the drain electrode, the interface of the semiconductor substrate with the first semiconductor layer is depleted, and the P-type semiconductor substrate has a potential higher than that of an electron that is a carrier, thus suppressing the leakage current flowing between the semiconductor substrate and the second semiconductor layer.

Further, in the first semiconductor device, it is preferable that: the conductive substrate is a P-type semiconductor substrate; the first semiconductor device further includes a P-type third semiconductor layer which is formed between the semiconductor substrate and the first semiconductor layer, and through which the source electrode passes, the P-type third semiconductor layer having a dopant concentration lower than that of the semiconductor substrate; and the thicknesses of the first semiconductor layer and the third semiconductor layer, and the dopant concentration of the third semiconductor layer are set such that a maximum voltage, which can be supported by the first semiconductor layer and a depletion layer extended in the third semiconductor layer, becomes higher than a maximum voltage applied to the drain electrode. In such an embodiment, the P-type third semiconductor layer, which reduces leakage current since its resistance is higher than that of the P-type semiconductor substrate, can be isolated from the P-type semiconductor substrate that reduces series resistance. Accordingly, the reduction of the series resistance can also be achieved.

Furthermore, in the first semiconductor device, it is preferable that: the conductive substrate is a P-type semiconductor substrate; the first semiconductor device further includes an N-type third semiconductor layer which is formed between the semiconductor substrate and the first semiconductor layer, and through which the source electrode passes; and the thicknesses of the first semiconductor layer and the third semiconductor layer, and the dopant concentration of the third semiconductor layer are set such that a maximum voltage, which can be supported by the first semiconductor layer and a depletion layer extended in the third semiconductor layer, becomes higher than a maximum voltage applied to the drain electrode. In such an embodiment, due to the high resistance first semiconductor layer and the depletion layer extended in the N-type third semiconductor layer, it becomes possible to achieve a breakdown voltage equal to or higher than a voltage applied between the P-type semiconductor substrate and the second semiconductor layer having the channel layer, and therefore, it becomes possible to further reduce the leakage current flowing between the semiconductor substrate and the channel layer.

In addition, in the first semiconductor device, it is preferable that: the conductive substrate is a P-type semiconductor substrate; the first semiconductor device further includes a third semiconductor layer which is formed between the semiconductor substrate and the first semiconductor layer, and through which the source electrode passes, the third semiconductor layer consisting of a multilayer structure having one or more PN junctions; and the thicknesses of the first semiconductor layer and the third semiconductor layer, and the dopant concentration of the third semiconductor layer are set such that a maximum voltage, which can be supported by the first semiconductor layer and a depletion layer extended in the third semiconductor layer, becomes higher than a maximum voltage applied to the drain electrode. In such an embodiment, due to not only the high resistance first semiconductor layer but also the depletion layer formed at the PN junction of the third semiconductor layer, it becomes possible to achieve a breakdown voltage equal to or higher than a voltage applied between the P-type semiconductor substrate and the second semiconductor layer having the channel layer, and therefore, it becomes possible to further reduce the leakage current flowing between the semiconductor substrate and the channel layer.

Besides, in the first semiconductor device, it is preferable that: the conductive substrate is an N-type semiconductor substrate; the first semiconductor device further includes a P-type third semiconductor layer which is formed between the semiconductor substrate and the first semiconductor layer, and through which the source electrode passes; and the thicknesses of the first semiconductor layer and the third semiconductor layer, and the dopant concentration of the third semiconductor layer are set such that a maximum voltage, which can be supported by the first semiconductor layer and a depletion layer extended in the third semiconductor layer, becomes higher than a maximum voltage applied to the drain electrode. In such an embodiment, due to the high resistance first semiconductor layer and the depletion layer extended in the P-type third semiconductor layer, it becomes possible to achieve a breakdown voltage equal to or higher than a voltage applied between the N-type semiconductor substrate and the second semiconductor layer having the channel layer, and therefore, it becomes possible to further reduce the leakage current flowing between the semiconductor substrate and the channel layer.

Moreover, in the first semiconductor device, it is preferable that: the conductive substrate is an N-type semiconductor substrate; the first semiconductor device further includes a third semiconductor layer which is formed between the semiconductor substrate and the first semiconductor layer, and through which the source electrode passes, the third semiconductor layer consisting of a multilayer structure having one or more PN junctions; and the thicknesses of the first semiconductor layer and the third semiconductor layer, and the dopant concentration of the third semiconductor layer are set such that a maximum voltage, which can be supported by the first semiconductor layer and a depletion layer extended in the third semiconductor layer, becomes higher than a maximum voltage applied to the drain electrode. In such an embodiment, due to not only the high resistance first semiconductor layer but also the depletion layer formed at the PN junction of the third semiconductor layer, it becomes possible to achieve a breakdown voltage equal to or higher than a voltage applied between the N-type semiconductor substrate and the second semiconductor layer having the channel layer, and therefore, it becomes possible to further reduce the leakage current flowing between the semiconductor substrate and the channel layer.

A second semiconductor device according to the present invention is characterized by including: a conductive substrate; a first semiconductor layer formed on the conductive substrate and made of a first Group III–V nitride semiconductor with a high resistance; a second semiconductor layer formed on the first semiconductor layer, having a channel layer, and made of a second Group III–V nitride semiconductor; and a source electrode, a drain electrode and a gate electrode which are selectively formed on the second semiconductor layer, wherein the drain electrode is filled in a through hole provided in the first semiconductor layer and the second semiconductor layer, and is thus electrically connected to the conductive substrate.

In the second semiconductor device, it is possible to form an electrode on a bottom surface of the conductive substrate without providing any via hole in the conductive substrate. Thus, formation of a via hole is facilitated and the thickness of the substrate does not have to be reduced; therefore, it becomes possible to obtain the semiconductor device including the Group III–V nitride semiconductors and having excellent high-frequency characteristic and high-power characteristic while maintaining the strength of the conductive substrate.

In the second semiconductor device, the thickness of the first semiconductor layer is preferably set such that the first semiconductor layer has a breakdown voltage higher than a maximum voltage applied to the drain electrode. In such an embodiment, since it is possible to suppress the leakage current flowing between the conductive substrate and the channel layer, the high-power characteristic can be improved.

Further, in the second semiconductor device, it is preferable that: the conductive substrate is an N-type semiconductor substrate; and the thickness of the first semiconductor layer and the dopant concentration of the semiconductor substrate are set such that a maximum voltage, which can be supported by the first semiconductor layer and a depletion layer extended in the semiconductor substrate, becomes higher than a maximum voltage applied to the drain electrode. In such an embodiment, it becomes possible to further reduce the leakage current flowing between the N-type semiconductor substrate and the second semiconductor layer having the channel layer. It should be noted that the N-type semiconductor substrate is used as the conductive substrate because if a positive drain potential is applied to the electrode on the bottom surface of the semiconductor substrate, the interface of the semiconductor substrate with the first semiconductor layer is depleted, thus suppressing the leakage current flowing between the semiconductor substrate and the second semiconductor layer.

Furthermore, in the second semiconductor device, it is preferable that: the conductive substrate is an N-type semiconductor substrate; the second semiconductor device further includes an N-type third semiconductor layer which is formed between the semiconductor substrate and the first semiconductor layer, and through which the drain electrode passes, the N-type third semiconductor layer having a dopant concentration lower than that of the semiconductor substrate; and the thicknesses of the first semiconductor layer and the third semiconductor layer, and the dopant concentration of the third semiconductor layer are set such that a maximum voltage, which can be supported by the first semiconductor layer and a depletion layer extended in the third semiconductor layer, becomes higher than a maximum voltage applied to the drain electrode. In such an embodiment, the N-type third semiconductor layer, which reduces leakage current since its resistance is higher than that of the N-type semiconductor substrate, can be isolated from the N-type semiconductor substrate that reduces series resistance. Accordingly, the reduction of the series resistance can also be achieved.

In addition, in the second semiconductor device, it is preferable that: the conductive substrate is an N-type semiconductor substrate; the second semiconductor device further includes a third semiconductor layer which is formed between the semiconductor substrate and the first semiconductor layer, and through which the drain electrode passes, the third semiconductor layer consisting of a multilayer structure having one or more PN junctions; and the thicknesses of the first semiconductor layer and the third semiconductor layer, and the dopant concentration of the third semiconductor layer are set such that a maximum voltage, which can be supported by the first semiconductor layer and a depletion layer extended in the third semiconductor layer, becomes higher than a maximum voltage applied to the drain electrode. In such an embodiment, due to not only the high resistance first semiconductor layer but also the depletion layer formed at the PN junction of the third semiconductor layer, it becomes possible to achieve a breakdown voltage equal to or higher than a voltage applied between the N-type semiconductor substrate and the second semiconductor layer having the channel layer, and therefore, it becomes possible to further reduce the leakage current flowing between the semiconductor substrate and the channel layer.

Moreover, in the second semiconductor device, it is preferable that: the conductive substrate is a P-type semiconductor substrate; the second semiconductor device further includes a third semiconductor layer which is formed between the semiconductor substrate and the first semiconductor layer, and through which the drain electrode passes, the third semiconductor layer consisting of a multilayer structure having one or more PN junctions; and the thicknesses of the first semiconductor layer and the third semiconductor layer, and the dopant concentration of the third semiconductor layer are set such that a maximum voltage, which can be supported by the first semiconductor layer and a depletion layer extended in the third semiconductor layer, becomes higher than a maximum voltage applied to the drain electrode. In such an embodiment, due to not only the high resistance first semiconductor layer but also the depletion layer formed at the PN junction of the third semiconductor layer, it becomes possible to achieve a breakdown voltage equal to or higher than a voltage applied between the P-type semiconductor substrate and the second semiconductor layer having the channel layer, and therefore, it becomes possible to further reduce the leakage current flowing between the semiconductor substrate and the channel layer.

The first semiconductor device preferably further includes: an insulating film formed so as to cover the second semiconductor layer, including the source electrode, the drain electrode and the gate electrode; and an interconnect formed on the insulating film and electrically connected to the drain electrode via an opening provided in the insulating film, wherein the thickness of the insulating film is set such that the insulating film has a breakdown voltage higher than a maximum voltage applied between the drain electrode and the gate electrode. In such an embodiment, it becomes possible to suppress the leakage current flowing between the drain electrode and the gate electrode. Furthermore, since the interconnect connected to the drain electrode can be located so as to cover associated elements, the series resistance of the interconnect can be reduced.

On the other hand, the second semiconductor device preferably further includes: an insulating film formed so as to cover the second semiconductor layer, including the source electrode, the drain electrode and the gate electrode; and an interconnect formed on the insulating film and electrically connected to the source electrode via an opening provided in the insulating film, wherein the thickness of the insulating film is set such that the insulating film has a breakdown voltage higher than a maximum voltage applied between the drain electrode and the source electrode. In such an embodiment, it becomes possible to suppress the leakage current flowing between the drain electrode and the source electrode. Furthermore, since the interconnect connected to the source electrode can be located so as to cover associated elements, the series resistance of the interconnect can be reduced.

In such a case, the insulating film preferably consists of benzocyclobutene or a multilayer structure including benzocyclobutene.

In the first semiconductor device, the source electrode is preferably made of a metal that exhibits an ohmic characteristic to the conductive substrate, and exhibits a Schottky characteristic to the first semiconductor layer and the second semiconductor layer.

On the other hand, in the second semiconductor device, the drain electrode is preferably made of a metal that exhibits an ohmic characteristic to the conductive substrate, and exhibits a Schottky characteristic to the first semiconductor layer and the second semiconductor layer.

Thus, since a metal having a Schottky barrier to the first semiconductor layer and the second semiconductor layer, each made of a Group III–V nitride semiconductor, is used, the leakage current can be further reduced due to the Schottky barrier provided at an interface between the metal and the Group III–V nitride semiconductors.

In such a case, the metal is preferably gold, silver, copper, platinum, palladium, nickel, chromium, iridium, tungsten, molybdenum, silicon or zinc, or a multilayer structure or alloy including at least two of these materials.

In the first or second semiconductor device, it is preferable that side faces of the through hole are covered with an oxide film formed by thermally oxidizing at least the first semiconductor layer and the second semiconductor layer. In such an embodiment, even if a metal highly reactive with a Group III–V nitride semiconductor is deposited inside the through hole, the deposited metal reacts with only a part of the thermal oxide film formed at the surface of the through hole, and does not react with nor erode the nitride semiconductor layers located outwardly of the metal. Thus, the leakage current leaking to the conductive substrate can be maintained at a low level.

In the first or second semiconductor device, the conductive substrate is preferably made of silicon, silicon carbide or gallium nitride.

DESCRIPTION OF THE PREFERRED EMBODIMENTS

First Embodiment

A first embodiment of the present invention will be described with reference to the associated drawing.

Figure 1:
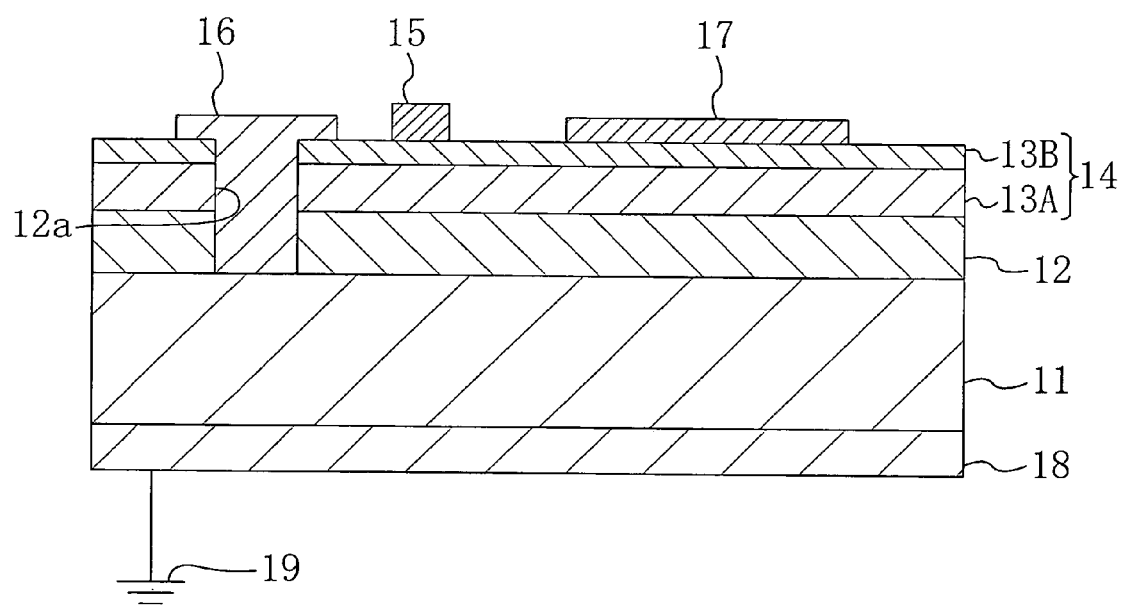
FIG. 1 is a schematic cross-sectional view illustrating a semiconductor device according to a first embodiment of the present invention.

FIG. 1 illustrates a semiconductor device according to the first embodiment of the present invention, and schematically shows the cross section of a heterojunction field effect transistor (HFET). As shown in FIG. 1, the HFET according to the first embodiment includes: a P$^+$-type conductive substrate 11 made of silicon (Si), for example; a buffer layer 12 as a first semiconductor layer made of a high resistance aluminum gallium nitride ($Al_xGa_{1-x}N$ where $0<x\leq1$); and an element-forming layer 14 as a second semiconductor layer including a channel layer (active layer) and made of a Group III–V nitride semiconductor. In this embodiment, the conductive substrate 11 is formed so that a dopant concentration of phosphorus (P) or arsenic (As) becomes about $1\times10^{20}$ cm$^{-3}$ by ion implantation, for example. Further, the buffer layer 12 is formed so as to reduce lattice mismatch between the conductive substrate 11 and the element-forming layer 14 grown over the conductive substrate 11.

The element-forming layer 14 provided on the buffer layer 12 by crystal growth is made up of a carrier-traveling layer 13A made of undoped gallium nitride (GaN); and a surface barrier layer (carrier supply layer) 13B formed on the carrier-traveling layer 13A and made of N-type aluminum gallium nitride ($Al_yGa_{1-y}N$ where $0<y\leq1$). In such an embodiment, a channel layer of 2DEG is formed in the vicinity of an interface that is a heterojunction of the carrier-traveling layer 13A with the surface barrier layer 13B.

On the surface barrier layer 13B, a gate electrode 15 formed of a multilayer structure including, e.g., nickel (Ni) and gold (Au), is selectively formed so as to have a Schottky characteristic. In regions located laterally of the gate electrode 15, a source electrode 16 and a drain electrode 17 each of which is an ohmic electrode are selectively formed.

The first embodiment is characterized in that the source electrode 16 is formed so as to be filled in a through hole (via hole) 12a that passes through the buffer layer 12, the carrier-traveling layer 13A and the surface barrier layer 13B to expose the conductive substrate 11. In this embodiment, as a material for forming the source electrode 16, it is preferable to use a metal material that exhibits an ohmic characteristic with the conductive substrate 11 made of silicon (Si) and exhibits a Schottky characteristic with the buffer layer 12 and the element-forming layer 14. For example, a metal such as gold (Au), silver (Ag), copper (Cu), platinum (Pt), palladium (Pd), nickel (Ni), chromium (Cr), iridium (Ir), tungsten (W), molybdenum (Mo), silicon (Si) or zinc (Zn) may be used, or a multilayer structure or alloy including at least two of these metals may be used. On the other hand, as a material for the drain electrode 17 formed on the surface barrier layer 13B made of N-type $Al_yGa_{1-y}N$, a multilayer structure including titanium (Ti) and aluminum (Al) may be used.

Formed on a surface of the conductive substrate 11 opposite to the buffer layer 12 (i.e., a bottom surface of the conductive substrate 11) is a bottom-surface electrode 18 which is connected to a ground power supply 19 and through which a ground potential is supplied to the source electrode 16. As a material for the bottom-surface electrode 18, a multilayer structure including titanium silicide (TiSi) and titanium nitride (TiN) may be used. It should be noted that if silicon carbide (SiC) is used for the P$^+$-type conductive substrate 11 instead of using silicon, a multilayer structure of Ti/Al may be used for the bottom-surface electrode 18.

As described above, in the first embodiment, the conductive substrate 11 is used as the substrate over which the element-forming layer 14 is formed; therefore, no via hole has to be provided in the conductive substrate 11. Thus, it is possible to omit not only the step of forming a via hole in the conductive substrate 11, but also a polishing step for reducing the thickness of the conductive substrate 11 itself in order to shallow the via hole. As a result, it becomes possible to electrically connect the source electrode 16 to the bottom-surface electrode 18 under the conductive substrate 11 while maintaining the substrate strength required for the conductive substrate 11.

Moreover, since high resistance $Al_xGa_{1-x}N$ having a breakdown voltage equal to or higher than a voltage applied between the conductive substrate 11 and the carrier-traveling layer 13A is used for the buffer layer 12, it is possible to considerably suppress the leakage current flowing between the conductive substrate 11 and the channel layer of the carrier-traveling layer 13A.

In this embodiment, the thickness of the high resistance buffer layer 12 and the dopant concentration of the conductive substrate 11 are preferably set such that a maximum voltage, which can be supported by the buffer layer 12 and a depletion layer extended in the conductive substrate 11, becomes higher than a maximum voltage applied to the drain electrode 17. In that case, it becomes possible to further reduce the leakage current flowing between the conductive substrate 11 and the carrier-traveling layer 13A.

Thus, according to the first embodiment, a source potential (ground potential) is applied to the bottom-surface electrode 18, and the through hole 12a does not have to be formed in the conductive substrate 11; therefore, formation of the through hole 12a is facilitated, and the thickness of the conductive substrate 11 can be set such that its strength is sufficiently maintained. Furthermore, since the leakage current produced between the conductive substrate 11 and the element-forming layer 14 can be suppressed by the high resistance buffer layer 12, it becomes possible to achieve high-frequency characteristic and high-power characteristic of the HFET.

Second Embodiment

Hereinafter, a second embodiment of the present invention will be described with reference to the associated drawing.

Figure 2:
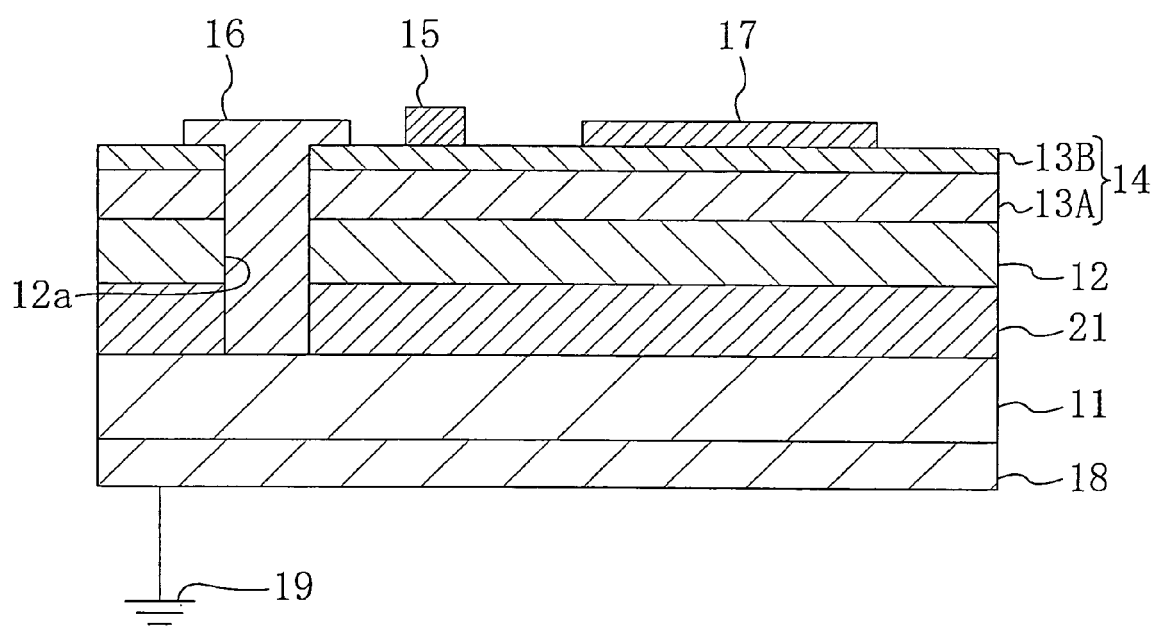
FIG. 2 is a schematic cross-sectional view illustrating a semiconductor device according to a second embodiment of the present invention.

FIG. 2 illustrates a semiconductor device according to the second embodiment of the present invention, and schematically shows the cross section of an HFET. In FIG. 2, the same constituting members as those shown in FIG. 1 are identified by the same reference characters, and thus the description thereof will be omitted.

As shown in FIG. 2, the HFET according to the second embodiment is provided, at its portion located between the P+-type conductive substrate 11 and the high resistance buffer layer 12, with at least one depletion-forming layer 21 as a third semiconductor layer which is made of P$^-$-type silicon having a dopant concentration lower than that of the conductive substrate 11, i.e., a resistance higher than that of the conductive substrate 11. In this embodiment, the thicknesses of the high resistance buffer layer 12 and the depletion-forming layer 21, and the dopant concentration thereof are set such that a maximum voltage, which can be supported by the buffer layer 12 and a depletion layer extended in the depletion-forming layer 21, becomes higher than a maximum voltage applied to the drain electrode 17.

In such an embodiment, the P$^+$-type conductive substrate 11 contributory to a reduction in series resistance can be isolated from the P$^-$-type depletion-forming layer 21 having a resistance higher than that of the conductive substrate 11 and contributory to a reduction in leakage current. Thus, it is possible to simultaneously realize the reduction of the leakage current produced between the carrier-traveling layer 13A and the conductive substrate 11, and the reduction of the series resistance between the source electrode 16 and the bottom-surface electrode 18.

Consequently, according to the second embodiment, the through hole 12a does not have to be formed in the conductive substrate 11; thus, formation of the through hole 12a is facilitated, and the thickness of the conductive substrate 11 can be set such that its strength is sufficiently maintained. Furthermore, since the leakage current produced between the conductive substrate 11 and the element-forming layer 14 can be suppressed by the high resistance buffer layer 12 and the depletion-forming layer 21, it becomes possible to achieve high-frequency characteristic and high-power characteristic of the HFET.

It should be noted that the conductivity type of the depletion-forming layer 21 made of P$^-$-type silicon may alternatively be N-type.

First Modified Example of Second Embodiment

Figure 3:
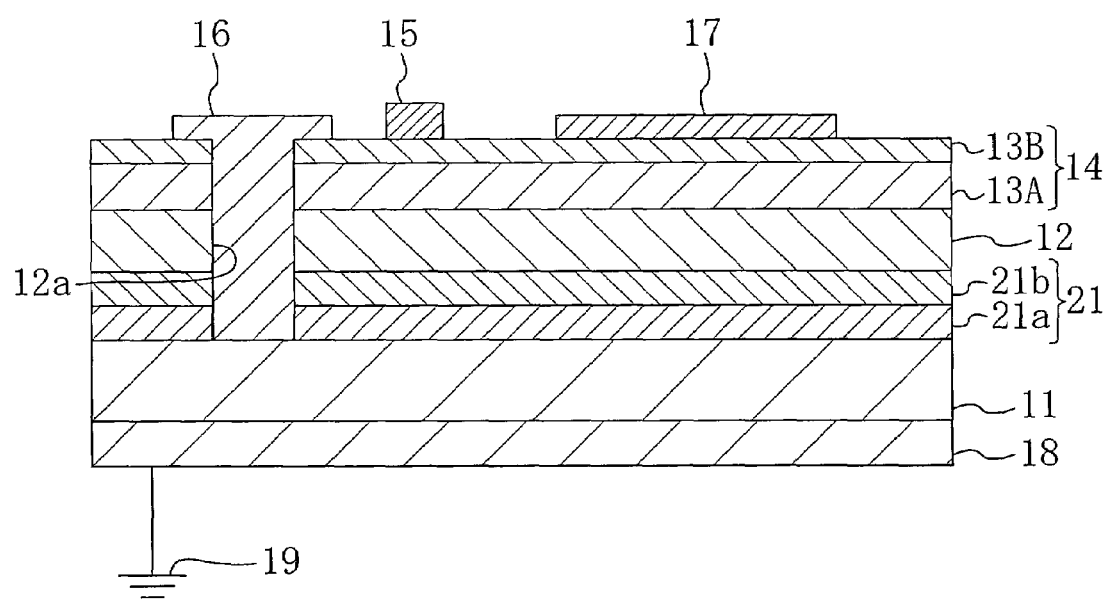
FIG. 3 is a schematic cross-sectional view illustrating a semiconductor device according to a first modified example of the second embodiment of the present invention.

FIG. 3 illustrates a semiconductor device according to a first modified example of the second embodiment of the present invention, and schematically shows the cross section of an HFET. In FIG. 3, the same constituting members as those shown in FIG. 2 are identified by the same reference characters, and thus the description thereof will be omitted.

In the first modified example, the depletion-forming layer 21 is formed so as to have a PN junction of a P-type lower layer 21a and an N-type upper layer 21b. In this case, the thicknesses of the high resistance buffer layer 12 and the depletion-forming layer 21, and the dopant concentrations of the lower layer 21a and the upper layer 21b are preferably set such that a maximum voltage, which can be supported by the buffer layer 12 and the depletion layer extended in the depletion-forming layer 21, becomes higher than a maximum voltage applied to the drain electrode 17.

Thus, due to the high resistance buffer layer 12 and the depletion layer formed at the PN junction of the depletion-forming layer 21, it becomes possible to achieve a breakdown voltage equal to or higher than a voltage applied between the conductive substrate 11 and the channel layer of the carrier-traveling layer 13A. Therefore, it is possible to reduce the leakage current produced between the carrier-traveling layer 13A and the conductive substrate 11, and it is also possible to reduce the series resistance between the source electrode 16 and the bottom-surface electrode 18.

Second Modified Example of Second Embodiment

Figure 4:
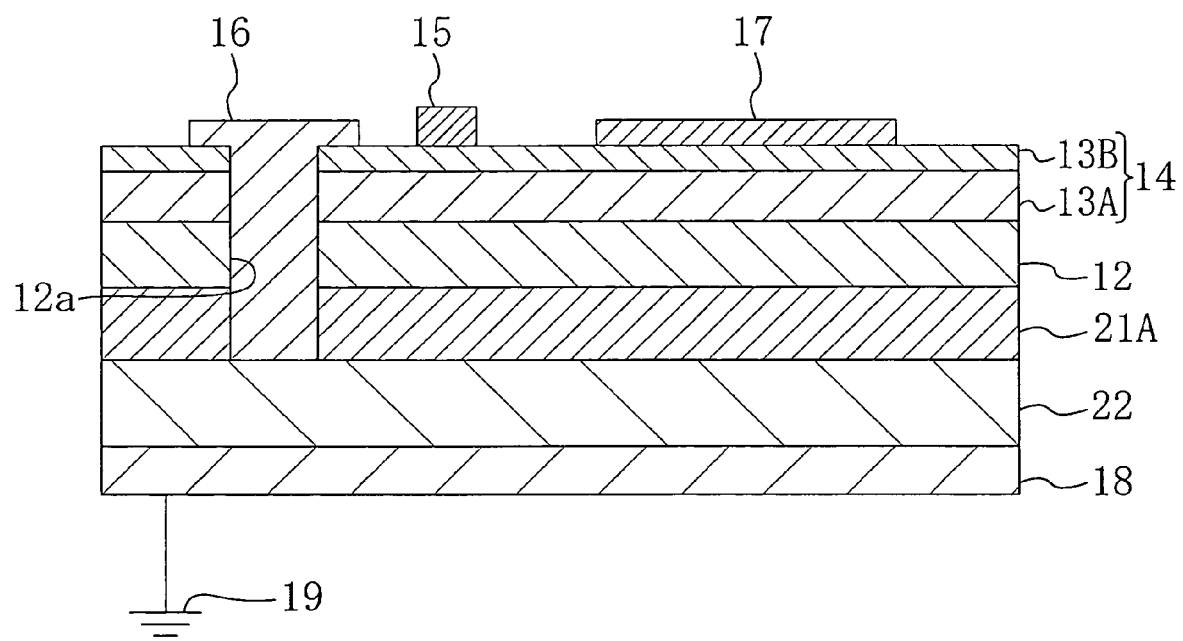
FIG. 4 is a schematic cross-sectional view illustrating a semiconductor device according to a second modified example of the second embodiment of the present invention.

FIG. 4 illustrates a semiconductor device according to a second modified example of the second embodiment of the present invention, and schematically shows the cross section of an HFET. In FIG. 4, the same constituting members as those shown in FIG. 2 are identified by the same reference characters, and thus the description thereof will be omitted.

In the second modified example, as a conductive substrate, a conductive substrate 22 made of N$^+$-type silicon into which boron (B) is implanted at a concentration of about $1 \times 10^{20}$ cm$^{-3}$ is used, and the P-type dopant concentration of a depletion-forming layer 21A is higher than that of the P$^-$-type depletion-forming layer 21 in the second embodiment. In this modified example, the thicknesses of the high resistance buffer layer 12 and the depletion-forming layer 21A, and the dopant concentration thereof are preferably set such that a maximum voltage, which can be supported by the buffer layer 12 and a depletion layer extended in the depletion-forming layer 21A, becomes higher than a maximum voltage applied to the drain electrode 17.

In such an embodiment, due to the high resistance buffer layer 12 and the depletion layer formed in the P-type depletion-forming layer 21A, it becomes possible to achieve a breakdown voltage equal to or higher than a voltage applied between the N$^+$-type conductive substrate 22 and the channel layer of the carrier-traveling layer 13A. Therefore, it is possible to reduce the leakage current produced between the carrier-traveling layer 13A and the conductive substrate 22, and it is also possible to reduce the series resistance between the source electrode 16 and the bottom-surface electrode 18.

It should be noted that in the second modified example, as the bottom-surface electrode 18 provided under the conductive substrate 22 made of N$^+$-type silicon, a multilayer structure including titanium silicide (TiSi) and titanium nitride (TiN) may be used.

Furthermore, if silicon carbide (SiC) is used for the N$^+$-type conductive substrate 22, nickel (Ni) alloyed with silicon carbide may be used as the bottom-surface electrode 18.

Third Modified Example of Second Embodiment

Figure 5:
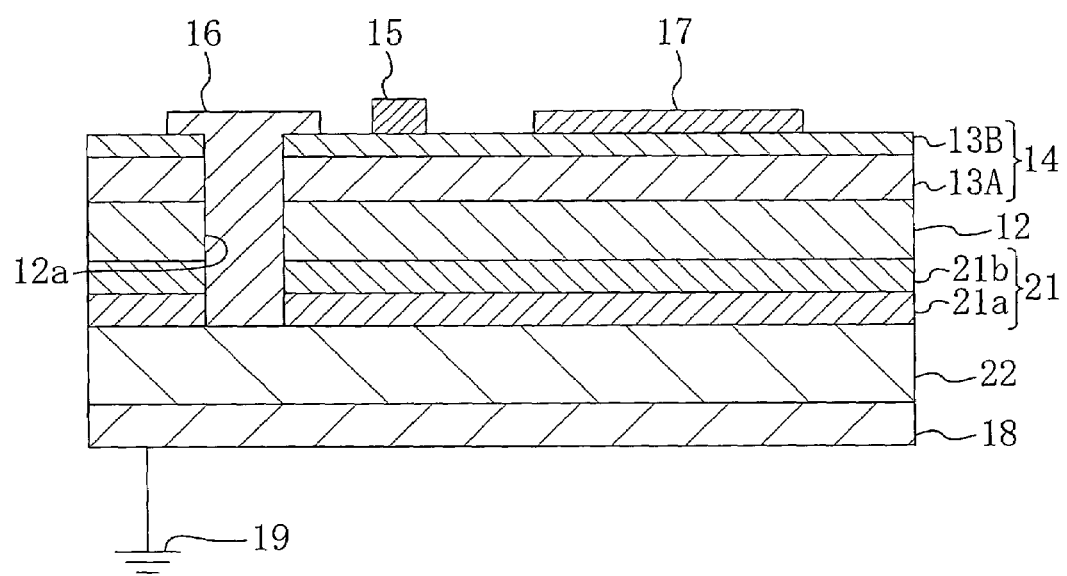
FIG. 5 is a schematic cross-sectional view illustrating a semiconductor device according to a third modified example of the second embodiment of the present invention.

FIG. 5 illustrates a semiconductor device according to a third modified example of the second embodiment of the present invention, and schematically shows the cross section of an HFET. In FIG. 5, the same constituting members as those shown in FIG. 3 are identified by the same reference characters, and thus the description thereof will be omitted.

In the third modified example, a conductive substrate 22 made of N$^+$-type silicon is used instead of the conductive substrate 11 made of the P$^+$-type silicon according to the first modified example. In this case, the thicknesses of the high resistance buffer layer 12 and the depletion-forming layer 21, and the dopant concentrations of the P-type lower layer 21a and the N-type upper layer 21b are preferably set such that a maximum voltage, which can be supported by the buffer layer 12 and the depletion layer extended in the depletion-forming layer 21, becomes higher than a maximum voltage applied to the drain electrode 17.

Thus, due to the high resistance buffer layer 12 and the depletion layer formed at the PN junction of the depletion-forming layer 21, it becomes possible to achieve a breakdown voltage equal to or higher than a voltage applied between the conductive substrate 22 and the channel layer of the carrier-traveling layer 13A. Therefore, it is possible to reduce the leakage current produced between the carrier-traveling layer 13A and the conductive substrate 22, and it is also possible to reduce the series resistance between the source electrode 16 and the bottom-surface electrode 18.

Third Embodiment

Hereinafter, a third embodiment of the present invention will be described with reference to the associated drawing.

Figure 6:
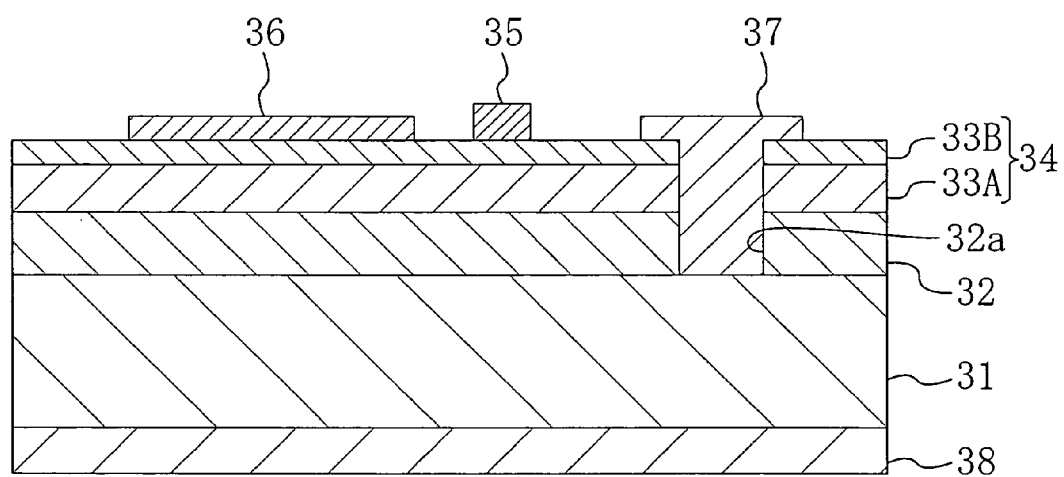
FIG. 6 is a schematic cross-sectional view illustrating a semiconductor device according to a third embodiment of the present invention.

FIG. 6 illustrates a semiconductor device according to the third embodiment of the present invention, and schematically shows the cross section of an HFET. As shown in FIG. 6, the HFET according to the third embodiment includes: an $N^+$-type conductive substrate 31 made of silicon (Si), for example; a buffer layer 32 as a first semiconductor layer made of a high resistance $Al_xGa_{1-x}N$ (where $0<x\leq 1$); and an element-forming layer 34 as a second semiconductor layer including a channel layer (active layer) and made of a Group III–V nitride semiconductor. In this embodiment, the conductive substrate 31 is formed so that a dopant concentration of boron (B) becomes about $1\times 10^{20}$ $cm^{-3}$ by ion implantation. Further, the buffer layer 32 is formed so as to reduce lattice mismatch between the conductive substrate 31 and the element-forming layer 34 grown over the conductive substrate 31.

The element-forming layer 34 provided on the buffer layer 32 by crystal growth is made up of: a carrier-traveling layer 33A made of undoped GaN; and a surface barrier layer (carrier supply layer) 33B formed on the carrier-traveling layer 33A and made of N-type $Al_yGa_{1-y}N$ (where $0<y\leq 1$). In such an embodiment, a channel layer of 2DEG is formed in the vicinity of an interface that is a heterojunction of the carrier-traveling layer 33A with the surface barrier layer 33B.

On the surface barrier layer 33B, a gate electrode 35 formed of a multilayer structure including, e.g., nickel (Ni) and gold (Au), is selectively formed so as to have a Schottky characteristic. In regions located laterally of the gate electrode 35, a source electrode 36 and a drain electrode 37 each of which is an ohmic electrode are selectively formed.

The third embodiment is characterized in that the drain electrode 37 is formed so as to be filled in a through hole (via hole) 32a that passes through the buffer layer 32, the carrier-traveling layer 33A and the surface barrier layer 33B to expose the conductive substrate 31. In this embodiment, as a material for forming the drain electrode 37, it is preferable to use a metal material that exhibits an ohmic characteristic with the conductive substrate 31 made of silicon (Si) and exhibits a Schottky characteristic with the buffer layer 32 and the element-forming layer 34. For example, a metal such as gold (Au), silver (Ag), copper (Cu), platinum (Pt), palladium (Pd), nickel (Ni), chromium (Cr), iridium (Ir), tungsten (W), molybdenum (o), silicon (Si) or zinc (Zn) may be used, or a multilayer structure or alloy including at least two of these metals may be used. On the other hand, as a material for the source electrode 36 formed on the surface barrier layer 33B made of N-type $Al_yGa_{1-y}N$, a multilayer structure including titanium (Ti) and aluminum (Al) may be used.

Formed on a surface of the conductive substrate 31 opposite to the buffer layer 32 (i.e., a bottom surface of the conductive substrate 31) is a bottom-surface electrode 38 through which a drain potential is supplied to the drain electrode 37. As a material for the bottom-surface electrode 38, a multilayer structure including titanium silicide (TiSi) and titanium nitride (TiN) may be used. It should be noted that if silicon carbide (SiC) is used for the $N^+$-type conductive substrate 31 instead of using silicon, nickel (Ni) alloyed with silicon carbide may be used as the bottom-surface electrode 38.

As described above, in the third embodiment, the conductive substrate 31 is used as the substrate over which the element-forming layer 34 is formed; therefore, no via hole has to be provided in the conductive substrate 31. Thus, it is possible to omit not only the step of forming a via hole in the conductive substrate 31, but also a polishing step for reducing the thickness of the conductive substrate 31 itself in order to shallow the via hole. As a result, it becomes possible to electrically connect the drain electrode 37 to the bottom-surface electrode 38 under the conductive substrate 31 while maintaining the substrate strength required for the conductive substrate 31.

Moreover, since high resistance $Al_xGa_{1-x}N$ having a breakdown voltage equal to or higher than a voltage applied between the conductive substrate 31 and the carrier-traveling layer 33A is used for the buffer layer 32, it is possible to considerably suppress the leakage current flowing between the conductive substrate 31 and the channel layer of the carrier-traveling layer 33A.

In this embodiment, the thickness of the high resistance buffer layer 32 and the dopant concentration of the conductive substrate 31 are preferably set such that a maximum voltage, which can be supported by the buffer layer 32 and a depletion layer extended in the conductive substrate 31, becomes higher than a maximum voltage applied to the drain electrode 37. In that case, it is possible to further reduce the leakage current flowing between the conductive substrate 31 and the carrier-traveling layer 33A.

Consequently, according to the third embodiment, a drain potential is applied to the bottom-surface electrode 38, and the through hole 32a does not have to be formed in the conductive substrate 31; thus, formation of the through hole 32a is facilitated, and the thickness of the conductive substrate 31 can be set such that its strength is sufficiently maintained. Furthermore, since the leakage current produced between the conductive substrate 31 and the element-forming layer 34 can be suppressed by the high resistance buffer layer 32, it becomes possible to achieve high-frequency characteristic and high-power characteristic of the HFET.

Fourth Embodiment

Hereinafter, a fourth embodiment of the present invention will be described with reference to the associated drawing.

Figure 7:
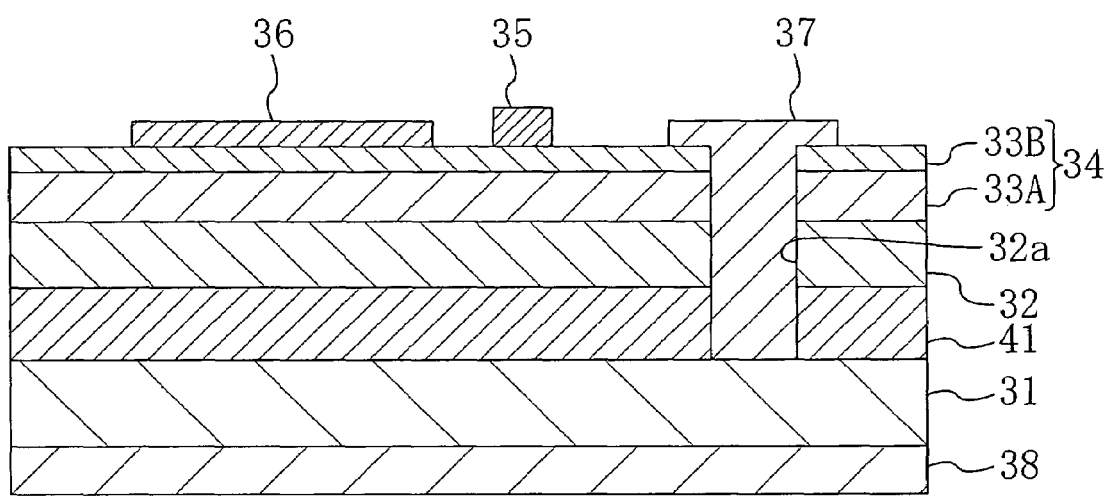
FIG. 7 is a schematic cross-sectional view illustrating a semiconductor device according to a fourth embodiment of the present invention.

FIG. 7 illustrates a semiconductor device according to the fourth embodiment of the present invention, and schematically shows the cross section of an HFET. In FIG. 7, the same constituting members as those shown in FIG. 6 are identified by the same reference characters, and thus the description thereof will be omitted.

As shown in FIG. 7, the HFET according to the fourth embodiment is provided, at its portion located between the $N^+$-type conductive substrate 31 and the high resistance buffer layer 32, with at least one depletion-forming layer 41 made of $N^-$-type silicon having a dopant concentration lower than that of the conductive substrate 31, i.e., a resistance higher than that of the conductive substrate 31. In this embodiment, the thicknesses of the high resistance buffer layer 32 and the depletion-forming layer 41, and the dopant concentration thereof are set such that a maximum voltage, which can be supported by the buffer layer 32 and a depletion layer extended in the depletion-forming layer 41, becomes higher than a maximum voltage applied to the drain electrode 37.

In such an embodiment, the N$^+$-type conductive substrate 31 contributory to a reduction in series resistance can be isolated from the N$^-$-type depletion-forming layer 41 having a resistance higher than that of the conductive substrate 31 and contributory to a reduction in leakage current. Thus, it is possible to simultaneously realize the reduction of the leakage current produced between the carrier-traveling layer 33A and the conductive substrate 31, and the reduction of the series resistance between the drain electrode 37 and the bottom-surface electrode 38.

Consequently, according to the fourth embodiment, the through hole 32a does not have to be formed in the conductive substrate 31; thus, formation of the through hole 32a is facilitated, and the thickness of the conductive substrate 31 can be set such that its strength is sufficiently maintained. Furthermore, since the leakage current produced between the conductive substrate 31 and the element-forming layer 34 can be suppressed by the high resistance buffer layer 32 and the depletion-forming layer 41, it becomes possible to achieve high-frequency characteristic and high-power characteristic of the HFET.

First Modified Example of Fourth Embodiment

Figure 8:
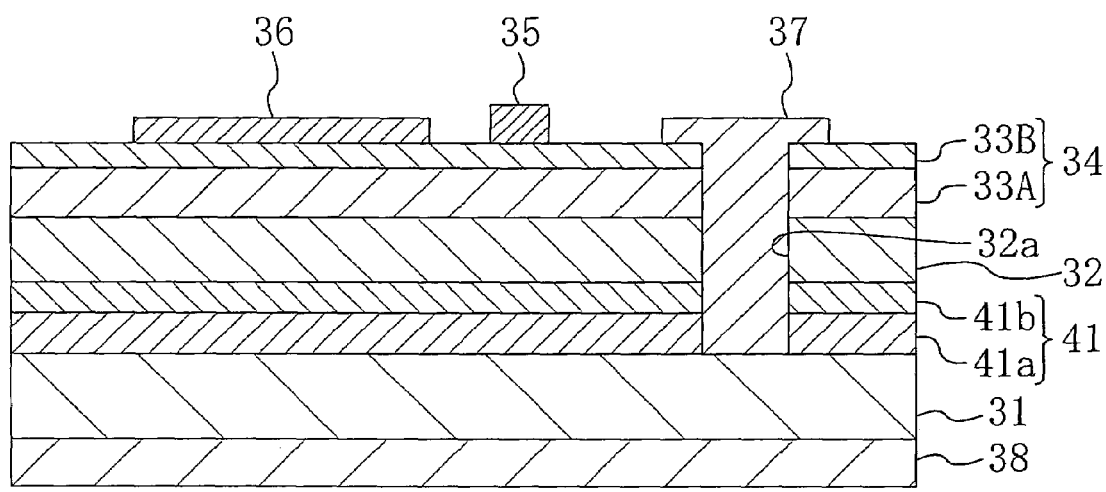
FIG. 8 is a schematic cross-sectional view illustrating a semiconductor device according to a first modified example of the fourth embodiment of the present invention.

FIG. 8 illustrates a semiconductor device according to a first modified example of the fourth embodiment of the present invention, and schematically shows the cross section of an HFET. In FIG. 8, the same constituting members as those shown in FIG. 7 are identified by the same reference characters, and thus the description thereof will be omitted.

In the first modified example, the depletion-forming layer 41 is formed so as to have a PN junction of a P-type lower layer 41a and an N-type upper layer 41b. In this case, the thicknesses of the high resistance buffer layer 32 and the depletion-forming layer 41, and the dopant concentrations of the lower layer 41a and the upper layer 41b are preferably set such that a maximum voltage, which can be supported by the buffer layer 32 and the depletion layer extended in the depletion-forming layer 41, becomes higher than a maximum voltage applied to the drain electrode 37.

Thus, due to the high resistance buffer layer 32 and the depletion layer formed at the PN junction of the depletion-forming layer 41, it becomes possible to achieve a breakdown voltage equal to or higher than a voltage applied between the conductive substrate 31 and the channel layer of the carrier-traveling layer 33A. Therefore, it is possible to reduce the leakage current produced between the carrier-traveling layer 33A and the conductive substrate 31, and it is also possible to reduce the series resistance between the drain electrode 37 and the bottom-surface electrode 38.

Second Modified Example of Fourth Embodiment

Figure 9:
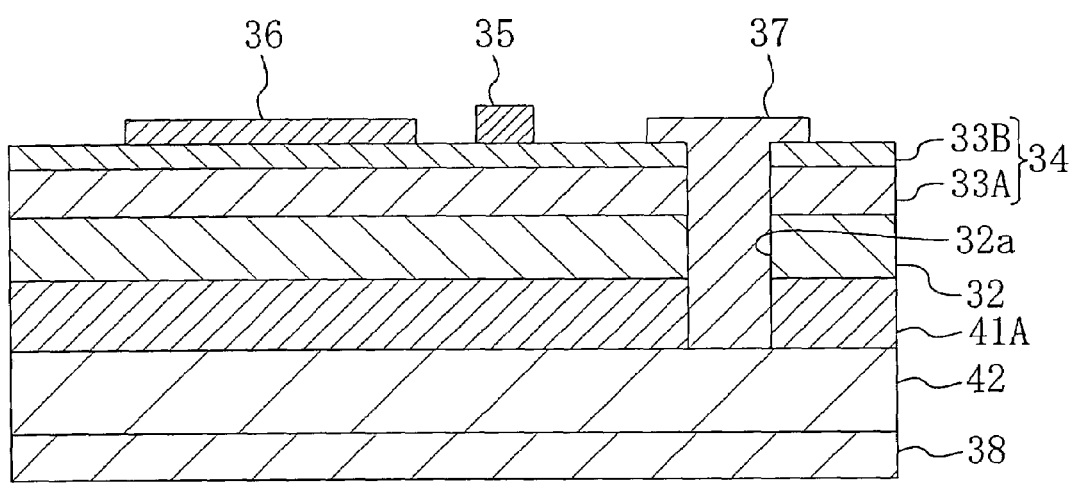
FIG. 9 is a schematic cross-sectional view illustrating a semiconductor device according to a second modified example of the fourth embodiment of the present invention.

FIG. 9 illustrates a semiconductor device according to a second modified example of the fourth embodiment of the present invention, and schematically shows the cross section of an HFET. In FIG. 9, the same constituting members as those shown in FIG. 7 are identified by the same reference characters, and thus the description thereof will be omitted.

In the second modified example, as a conductive substrate, a conductive substrate 42 made of P$^+$-type silicon into which phosphorus (P) or arsenic (As) is implanted at a concentration of about $1 \times 10^{20}$ cm$^{-3}$ is used, and the dopant concentration of the depletion-forming layer 41A is higher than that of the depletion-forming layer 41 in the fourth embodiment. In this modified example, the thicknesses of the high resistance buffer layer 32 and the depletion-forming layer 41A, and the dopant concentration thereof are preferably set such that a maximum voltage, which can be supported by the buffer layer 32 and a depletion layer extended in the depletion-forming layer 41A, becomes higher than a maximum voltage applied to the drain electrode 37.

In such an embodiment, due to the high resistance buffer layer 32 and the depletion layer formed in the N-type depletion-forming layer 41A, it becomes possible to achieve a breakdown voltage equal to or higher than a voltage applied between the P$^+$-type conductive substrate 42 and the channel layer of the carrier-traveling layer 33A. Therefore, it is possible to reduce the leakage current produced between the carrier-traveling layer 33A and the conductive substrate 42, and it is also possible to reduce the series resistance between the drain electrode 37 and the bottom-surface electrode 38.

It should be noted that in the second modified example, as the bottom-surface electrode 38 provided under the conductive substrate 42 made of P$^+$-type silicon, a multilayer structure including titanium silicide (TiSi) and titanium nitride (TiN) may be used.

Furthermore, if silicon carbide (SiC) is used for the P$^+$-type conductive substrate 42, a multilayer structure including titanium (Ti) and aluminum (Al) may be used as the bottom-surface electrode 38.

Third Modified Example of Fourth Embodiment

Figure 10:
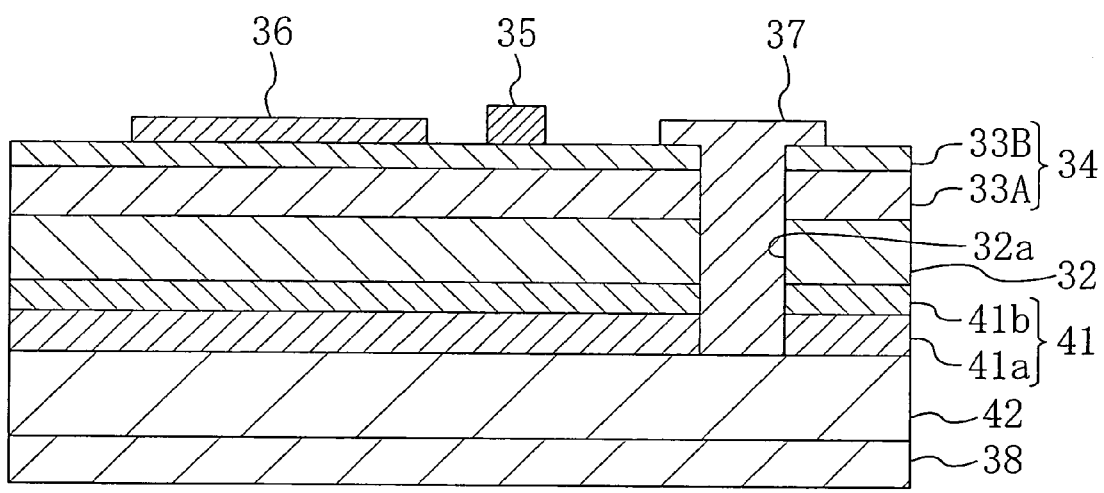
FIG. 10 is a schematic cross-sectional view illustrating a semiconductor device according to a third modified example of the fourth embodiment of the present invention.

FIG. 10 illustrates a semiconductor device according to a third modified example of the fourth embodiment of the present invention, and schematically shows the cross section of an HFET. In FIG. 10, the same constituting members as those shown in FIG. 8 are identified by the same reference characters, and thus the description thereof will be omitted.

In the third modified example, a conductive substrate 42 made of P$^+$-type silicon is used instead of the conductive substrate 31 made of the N$^+$-type silicon according to the first modified example. In this case, the thicknesses of the high resistance buffer layer 32 and the depletion-forming layer 41, and the dopant concentrations of the P-type lower layer 41a and the N-type upper layer 41b are preferably set such that a maximum voltage, which can be supported by the buffer layer 32 and the depletion layer extended in the depletion-forming layer 41, becomes higher than a maximum voltage applied to the drain electrode 37.

Thus, due to the high resistance buffer layer 32 and the depletion layer formed at the PN junction of the depletion-forming layer 41, it becomes possible to achieve a breakdown voltage equal to or higher than a voltage applied between the conductive substrate 42 and the channel layer of the carrier-traveling layer 33A. Therefore, it is possible to reduce the leakage current produced between the carrier-traveling layer 33A and the conductive substrate 42, and it is also possible to reduce the series resistance between the drain electrode 37 and the bottom-surface electrode 38.

Fifth Embodiment

Hereinafter, a fifth embodiment of the present invention will be described with reference to the associated drawing.

Figure 11:
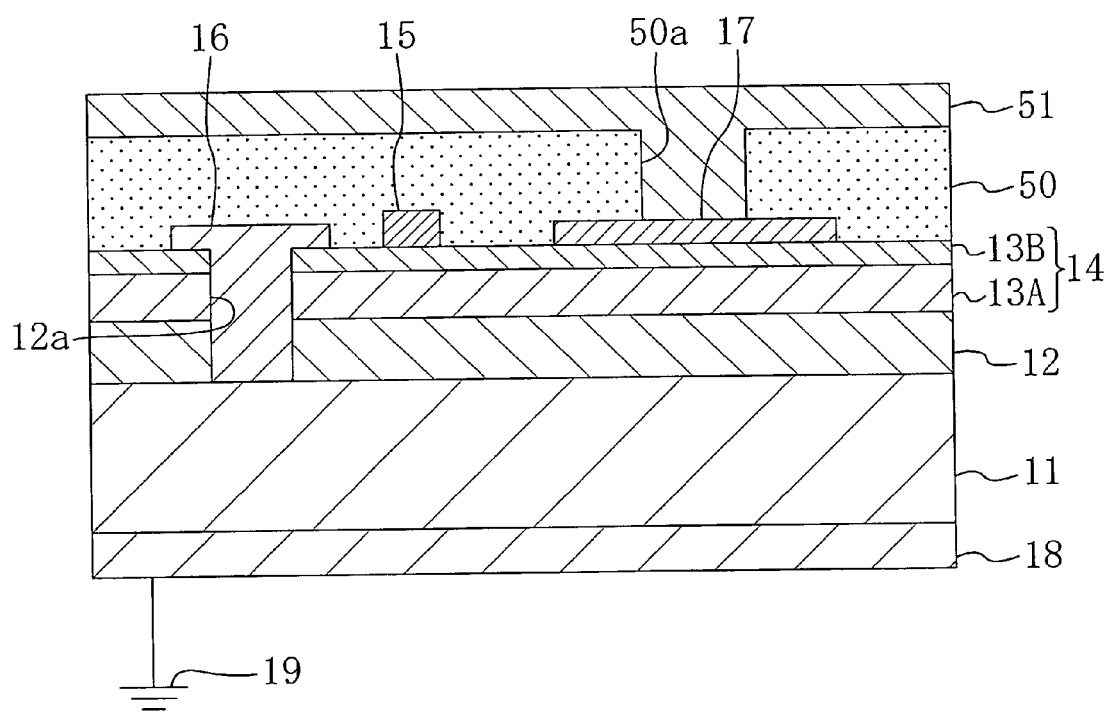
FIG. 11 is a schematic cross-sectional view illustrating a semiconductor device according to a fifth embodiment of the present invention.

FIG. 11 illustrates a semiconductor device according to the fifth embodiment of the present invention, and schematically shows the cross section of an HFET. In FIG. 11, the same constituting members as those shown in FIG. 1 are identified by the same reference characters, and thus the description thereof will be omitted.

The HFET according to the fifth embodiment has an insulating film 50 formed over the entire surface of the element-forming layer 14 of the HFET according to the first embodiment, including the surfaces of the gate electrode 15, the source electrode 16 and the drain electrode 17. On the insulating film 50, a metal interconnect 51 made of aluminum (Al) or copper (Cu), for example, is formed so as to be filled in an opening 50a, which exposes the drain electrode 17, and so as to be electrically connected to the drain electrode 17. In this embodiment, silicon oxide or silicon nitride, for example, may be used for the insulating film 50, and furthermore, it is preferable to use, for example, benzocyclobutene BCB) with a dielectric constant lower than that of silicon oxide or the like, or a multilayer structure including benzocyclobutene.

In this embodiment, the thickness of the insulating film 50 is set such that the breakdown voltage of the insulating film 50 is higher than a maximum voltage applied between the drain electrode 17 and the gate electrode 15. In such an embodiment, it is possible to suppress the current flowing between the drain electrode 17 and the gate electrode 15.

Further, the metal interconnect 51 connected to the drain electrode 17 is located so as to cover elements of the HFET, and therefore, the series resistance between the metal interconnect 51 and the drain electrode 17 can be reduced. As a result, it becomes possible to achieve high-frequency characteristic and high-power characteristic of the HFET.

It should be noted that the fifth embodiment is applicable to the case where the depletion-forming layer 21 or 21A is provided between the conductive substrate 11 or 22 and the buffer layer 12 as in the second embodiment or the modified example thereof.

Sixth Embodiment

Hereinafter, a sixth embodiment of the present invention will be described with reference to the associated drawing.

Figure 12:
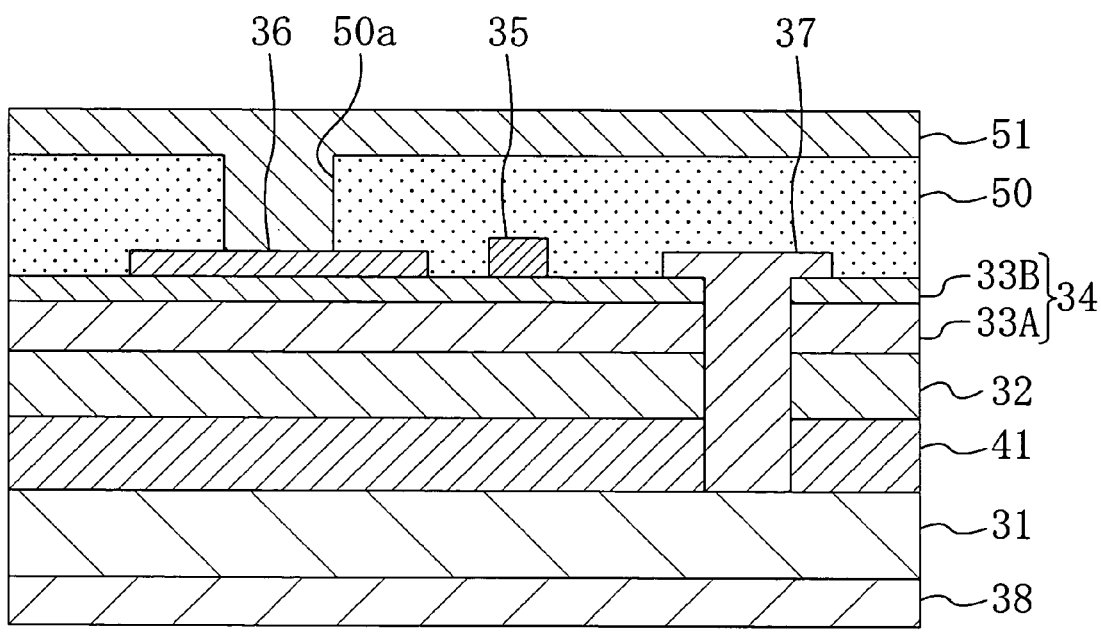
FIG. 12 is a schematic cross-sectional view illustrating a semiconductor device according to a sixth embodiment of the present invention.

FIG. 12 illustrates a semiconductor device according to the sixth embodiment of the present invention, and schematically shows the cross section of an HFET. In FIG. 12, the same constituting members as those shown in FIG. 7 are identified by the same reference characters, and thus the description thereof will be omitted.

The HFET according to the sixth embodiment has an insulating film 50 formed over the entire surface of the element-forming layer 34 of the HFET according to the fourth embodiment, including the surfaces of the gate electrode 35, the source electrode 36 and the drain electrode 37. On the insulating film 50, a metal interconnect 51 made of aluminum (Al) or copper (Cu), for example, is formed so as to be filled in an opening 50a, which exposes the source electrode 36, and so as to be electrically connected to the source electrode 36. In this embodiment, silicon oxide or silicon nitride, for example, may be used for the insulating film 50, and furthermore, it is preferable to use, for example, benzocyclobutene (BCB) with a dielectric constant lower than that of silicon oxide or the like, or a multilayer structure including benzocyclobutene.

In this embodiment, the thickness of the insulating film 50 is set such that the breakdown voltage of the insulating film 50 is higher than a maximum voltage applied between the drain electrode 37 and the source electrode 36. In such an embodiment, it is possible to suppress the leakage current flowing between the drain electrode 37 and the source electrode 36.

Further, the metal interconnect 51 connected to the source electrode 36 is located so as to cover elements of the HFET, and therefore, the series resistance between the metal interconnect 51 and the source electrode 36 can be reduced. As a result, it becomes possible to achieve high-frequency characteristic and high-power characteristic of the HFET.

It should be noted that the sixth embodiment is applicable to the HFET described in the third embodiment, the fourth embodiment or each modified example thereof Seventh Embodiment Hereinafter, a seventh embodiment of the present invention will be described with reference to the associated drawing.

Figure 13:
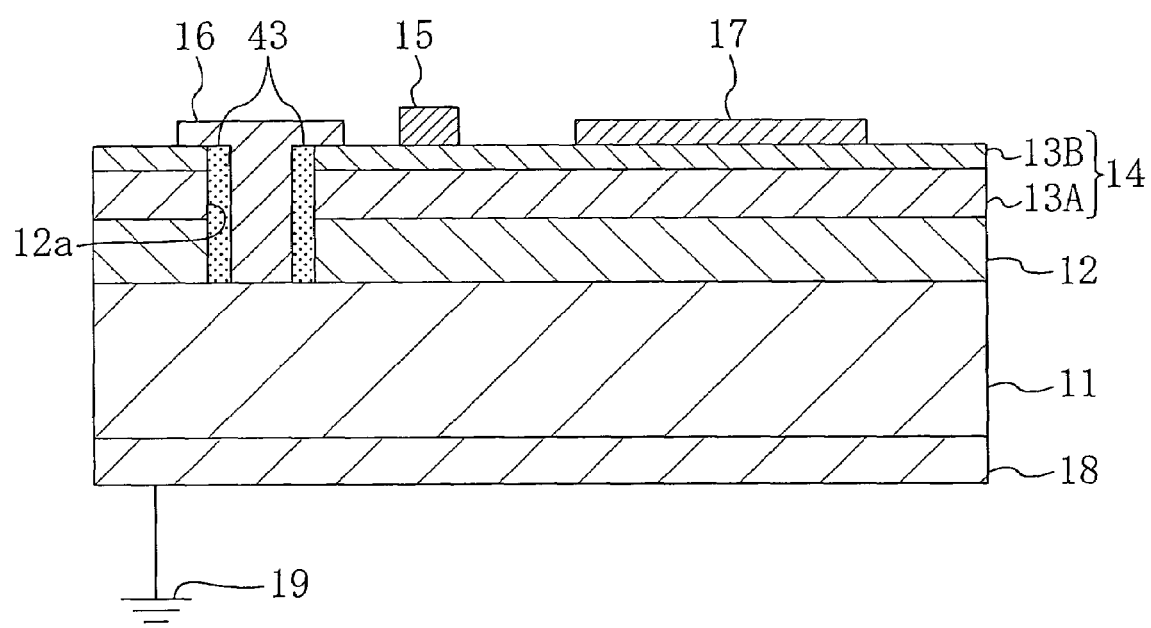
FIG. 13 is a schematic cross-sectional view illustrating a semiconductor device according to a seventh embodiment of the present invention.
Figure 14:
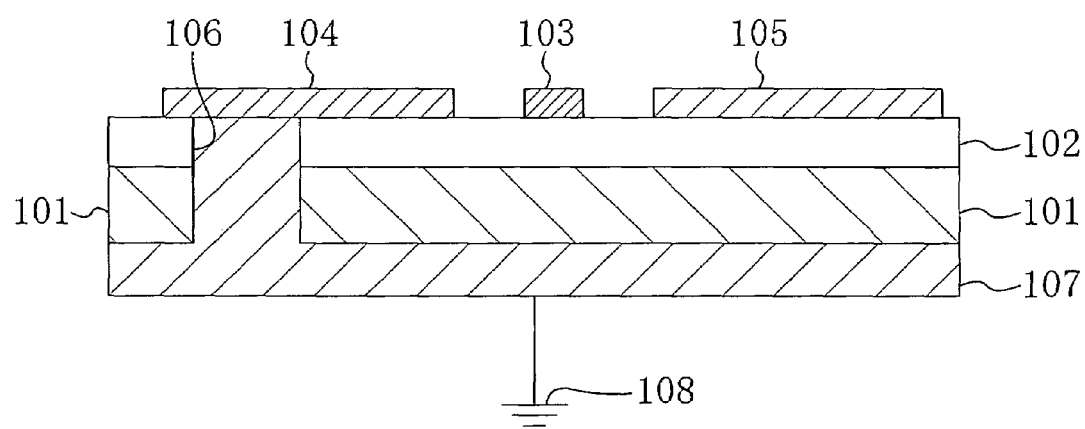
FIG. 14 is a schematic cross-sectional view illustrating a FET in which a conventional via hole structure is used.

FIG. 13 illustrates a semiconductor device according to the seventh embodiment of the present invention, and schematically shows the cross section of an HFET. In FIG. 13, the same constituting members as those shown in FIG. 1 are identified by the same reference characters, and thus the description thereof will be omitted.

In the seventh embodiment, a thermal oxide film 43 is provided at side faces of the through hole 12a, into which the source electrode 16 is filled, by selectively thermally oxidizing these side faces.

In this manner, the thermal oxide film is formed at the side faces of the through hole 12a by thermally oxidizing the element-forming layer 14 itself; thus, even if a metal material highly reactive with a Group III–V nitride semiconductor, e.g., a metal consisting of a multilayer structure including titanium (Ti) and gold (Au), is used, this metal only reacts with a part of the thermal oxide film 43 at the side faces of the through hole 12a, and does not react with nor erode the element-forming layer 14. As a result, the leakage current flowing to the conductive substrate 11 via side faces of the source electrode 16 can be kept at a low level, and therefore, it becomes possible to achieve high-frequency characteristic and high-power characteristic of the HFET.

It should be noted that, other than a multilayer structure including titanium and gold, a single metal such as titanium, aluminum, tin or gold, or a multilayer metal film or alloy formed by combining these metals may be used as a material for forming the drain electrode 16. Even in that case, the similar effects can be achieved.

Further, the seventh embodiment is also applicable to the HFET described in each of the first through sixth embodiments or each modified example thereof.

Furthermore, in the first through seventh embodiments and the modified examples thereof, conductive silicon (Si) is used for the conductive substrates 11, 22, 31 and 42; however, instead of silicon, conductive silicon carbide (SiC) or conductive gallium nitride (GaN) may alternatively be used.

Moreover, even if the buffer layer 12 or 32 grown on the conductive substrate at least partially includes a P-type semiconductor layer in the first through seventh embodiments and the modified examples thereof, it becomes possible to achieve a breakdown voltage equal to or higher than a voltage applied between the conductive substrate and the element-forming layer due to a depletion layer of the buffer layer, and thus the leakage current flowing between the conductive substrate and the element-forming layer can be reduced.

As described above, each semiconductor device according to the present invention can be provided with the bottom-surface electrode while no through hole is provided in the conductive substrate. Accordingly, the present invention has the effect of obtaining a semiconductor device including a Group III–V nitride semiconductor and having excellent high-frequency characteristic and high-power characteristic while maintaining the strength of a substrate, and the inventive semiconductor device is particularly useful, for example, as a field effect semiconductor device provided with an electrode on a bottom surface of a substrate.

The invention claimed is:

1. A semiconductor device comprising:
a conductive substrate;
a first semiconductor layer formed on the conductive substrate and made of a first Group III–V nitride semiconductor;
a second semiconductor layer formed on the first semiconductor layer, having a channel layer, and made of a second Group III–V nitride semiconductor; and
a source electrode, a drain electrode and a gate electrode which are selectively formed on the second semiconductor layer,
wherein the source electrode electrically connected to the conductive substrate via a through hole provided in the first semiconductor layer and the second semiconductor layer, and wherein the through hole is provided so as to not pass through the conductive substrate.

2. The semiconductor device of claim 1,
wherein the thickness of the first semiconductor layer is set such that the first semiconductor layer has a breakdown voltage higher than a maximum voltage applied to the drain electrode.

3. The semiconductor device of claim 1,
wherein the conductive substrate is a P-type semiconductor substrate, and
wherein the thickness of the first semiconductor layer and the dopant concentration of the semiconductor substrate are set such that a maximum voltage, which can be supported by the first semiconductor layer and a depletion layer extended in the semiconductor substrate, becomes higher than a maximum voltage applied to the drain electrode.

4. The semiconductor device of claim 1,
wherein the conductive substrate is a P-type semiconductor substrate,
wherein the device further comprises a P-type third semiconductor layer which is formed between the semiconductor substrate and the first semiconductor layer, the P-type third semiconductor layer having a dopant concentration lower than that of the semiconductor substrate,
wherein the source electrode is electrically connected to the semiconductor substrate via a through hole provided in the first semiconductor layer, the second semiconductor layer and the third semiconductor layer, and
wherein the thicknesses of the first semiconductor layer and the third semiconductor layer, and the dopant concentration of the third semiconductor layer are set such that a maximum voltage, which can be supported by the first semiconductor layer and a depletion layer extended in the third semiconductor layer, becomes higher than a maximum voltage applied to the drain electrode.

5. The semiconductor device of claim 1,
wherein the conductive substrate is a P-type semiconductor substrate,
wherein the device further comprises an N-type third semiconductor layer which is formed between the semiconductor substrate and the first semiconductor layer,
wherein the source electrode is electrically connected to the semiconductor substrate via a through hole provided in the first semiconductor layer, the second semiconductor layer and the third semiconductor layer, and
wherein the thicknesses of the first semiconductor layer and the third semiconductor layer, and the dopant concentration of the third semiconductor layer are set such that a maximum voltage, which can be supported by the first semiconductor layer and a depletion layer extended in the third semiconductor layer, becomes higher than a maximum voltage applied to the drain electrode.

6. The semiconductor device of claim 1,
wherein the conductive substrate is a P-type semiconductor substrate,
wherein the device further comprises a third semiconductor layer which is formed between the semiconductor substrate and the first semiconductor layer, the third semiconductor layer consisting of a multilayer structure having one or more PN junctions,
wherein the source electrode is electrically connected to the semiconductor substrate via a through hole provided in the first semiconductor layer, the second semiconductor layer and the third semiconductor layer, and
wherein the thicknesses of the first semiconductor layer and the third semiconductor layer, and the dopant concentration of the third semiconductor layer are set such that a maximum voltage, which can be supported by the first semiconductor layer and a depletion layer extended in the third semiconductor layer, becomes higher than a maximum voltage applied to the drain electrode.

7. The semiconductor device of claim 1,
wherein the conductive substrate is an N-type semiconductor substrate,
wherein the device further comprises a P-type third semiconductor layer which is formed between the semiconductor substrate and the first semiconductor layer,
wherein the source electrode is electrically connected to the semiconductor substrate via a through hole provided in the first semiconductor layer, the second semiconductor layer and the third semiconductor layer, and
wherein the thicknesses of the first semiconductor layer and the third semiconductor layer, and the dopant concentration of the third semiconductor layer are set such that a maximum voltage, which can be supported by the first semiconductor layer and a depletion layer extended in the third semiconductor layer, becomes higher than a maximum voltage applied to the drain electrode.

8. The semiconductor device of claim 1,
wherein the conductive substrate is an N-type semiconductor substrate,
wherein the device further comprises a third semiconductor layer which is formed between the semiconductor substrate and the first semiconductor layer, the third semiconductor layer consisting of a multilayer structure having one or more PN junctions, wherein the source electrode is electrically connected to the semiconductor substrate via a through hole provided in the first semiconductor layer, the second semiconductor layer and the third semiconductor layers, and wherein the thicknesses of the first semiconductor layer and the third semiconductor layer, and the dopant concentration of the third semiconductor layer are set such that a maximum voltage, which can be supported by the first semiconductor layer and a depletion layer extended in the third semiconductor layer, becomes higher than a maximum voltage applied to the drain electrode.

9. The semiconductor device of claim 1, further comprising:

an insulating film formed so as to cover the second semiconductor layer, including the source electrode, the drain electrode and the gate electrode; and a metal layer formed on the insulating film and electrically connected to the drain electrode via an opening provided in the insulating film, wherein the thickness of the insulating film is set such that the insulating film has a breakdown voltage higher than a maximum voltage applied between the drain electrode and the gate electrode.

10. The semiconductor device of claim 9, wherein the insulating film consists of benzocyclobutene or a multilayer structure comprising benzocyclobutene.

11. The semiconductor device of claim 1, wherein the source electrode is made of a metal that exhibits an ohmic characteristic to the conductive substrate, and exhibits a Schottky characteristic to the first semiconductor layer and the second semiconductor layer.

12. The semiconductor device of claim 11, wherein the metal is gold, silver, copper, platinum, palladium, nickel, chromium, iridium, tungsten, molybdenum, silicon or zinc, or a multilayer structure or alloy comprising at least two of these materials.

13. The semiconductor device of claim 1, wherein side faces of the through hole are covered with an oxide film formed by thermally oxidizing at least the first semiconductor layer and the second semiconductor layer.

14. The semiconductor device of claim 1, wherein the conductive substrate is made of silicon, silicon carbide or gallium nitride.

* * * * *